United States Patent
Jung et al.

(10) Patent No.: US 10,403,759 B2
(45) Date of Patent: Sep. 3, 2019

(54) LOGIC CIRCUITRY USING THREE DIMENSIONALLY STACKED DUAL-GATE THIN-FILM TRANSISTORS

(71) Applicant: POSTECH ACADEMY-INDUSTRY FOUNDATION, Pohang-si (KR)

(72) Inventors: Sungjune Jung, Pohang-si (KR); Jimin Kwon, Paju-si (KR)

(73) Assignee: POSTECH ACADEMY-INDUSTRY FOUNDATION, Pohang-si (KR)

( * ) Notice: Subject to any disclaimer, the term of this patent is extended or adjusted under 35 U.S.C. 154(b) by 0 days.

(21) Appl. No.: 15/907,444

(22) Filed: Feb. 28, 2018

(65) Prior Publication Data
US 2018/0254351 A1 Sep. 6, 2018

(30) Foreign Application Priority Data
Mar. 2, 2017 (KR) .................. 10-2017-0027005

(51) Int. Cl.
*H01L 29/786* (2006.01)
*H01L 51/05* (2006.01)
(Continued)

(52) U.S. Cl.
CPC ...... *H01L 29/78648* (2013.01); *H01L 27/124* (2013.01); *H01L 27/1225* (2013.01);
(Continued)

(58) Field of Classification Search
USPC ................................. 257/40, 686; 438/109
See application file for complete search history.

(56) References Cited

U.S. PATENT DOCUMENTS

2005/0239238 A1* 10/2005 Schuele .................. H01L 27/12
438/149
2006/0066512 A1* 3/2006 Afentakis ................ G09G 3/20
345/55
(Continued)

FOREIGN PATENT DOCUMENTS

JP 2006-196496 7/2006
KR 10-2012-0037882 4/2012
KR 10-2013-0061637 6/2013

OTHER PUBLICATIONS

KIPO, Office Action of KR 10-2017-0027005 dated Mar. 20, 2018.

*Primary Examiner* — Long K Tran
(74) *Attorney, Agent, or Firm* — Lex IP Meister, PLLC (57) ABSTRACT

Disclosed is a logic circuit using three-dimensionally stacked dual-gate thin-film transistors, including a substrate, a first dual-gate thin-film transistor on the substrate, a second dual-gate thin-film transistor on the first dual-gate thin-film transistor, and a third dual-gate thin-film transistor on the second dual-gate thin-film transistor, wherein the first dual-gate thin-film transistor, the second dual-gate thin-film transistor and the third dual-gate thin-film transistor are electrically connected to each other. The logic circuit of the invention is configured such that dual-gate thin-film transistors are three-dimensionally stacked, whereby the advantages of the dual-gate structure and of thin-film transistors can be exhibited together and the degree of integration can be drastically increased, and a logic gate is made in the area of a single transistor, thereby remarkably simplifying wire and circuit designs.

21 Claims, 6 Drawing Sheets

(51) Int. Cl.
*H01L 27/28* (2006.01)
*H01L 51/00* (2006.01)
*H03K 19/0948* (2006.01)
*H03K 19/20* (2006.01)
*H03K 19/21* (2006.01)
*H01L 27/12* (2006.01)
*H01L 27/06* (2006.01)

(52) U.S. Cl.
CPC ........ *H01L 27/281* (2013.01); *H01L 29/7869* (2013.01); *H01L 51/0035* (2013.01); *H01L 51/052* (2013.01); *H01L 51/0554* (2013.01); *H01L 51/0558* (2013.01); *H03K 19/0948* (2013.01); *H03K 19/20* (2013.01); *H03K 19/215* (2013.01); *H01L 27/0688* (2013.01)

(56) References Cited

U.S. PATENT DOCUMENTS

| | | | |
|---|---|---|---|
| 2006/0189049 A1* | 8/2006 | Afentakis | H01L 29/78624 438/151 |
| 2010/0026346 A1 | 2/2010 | Chiang et al. | |
| 2010/0148825 A1* | 6/2010 | Park | H01L 27/0207 326/121 |
| 2015/0303217 A1* | 10/2015 | Tanaka | H01L 29/78606 257/43 |
| 2015/0318856 A1* | 11/2015 | Balandin | H03K 5/19 326/101 |

\* cited by examiner

LOGIC CIRCUITRY USING THREE DIMENSIONALLY STACKED DUAL-GATE THIN-FILM TRANSISTORS

BACKGROUND OF THE INVENTION

1. Technical Field

The present invention relates to a logic circuit technique using three-dimensionally stacked dual-gate thin-film transistors, and more particularly to a technique in which inputs are independently applied to two gates of a dual-gate transistor and thus the single dual-gate transistor is used as two single-gate transistors which are connected in parallel, and such dual-gate transistors are stacked and thus a logic gate is made through integration in the area of a single transistor, thereby increasing the degree of integration of transistors and decreasing the complexity of wiring to thus enable efficient integrated circuit design in terms of space, effort and cost.

2. Description of the Related Art

The degree of integration of transistors is an index indicating the number of transistors per unit area. As the degree of process integration increases, circuits having various functions may be formed using a larger number of transistors on a substrate having the same area. Over the past decades, the degree of integration of transistors has doubled at temporal intervals of 18 months according to Moore's Law, but this increase is not expected to follow Moore's law any further due to recent physical or process limitations. In order to overcome these limitations, thorough research into the integration process of transistors using a three-dimensional space such as FinFET or wafer die stacking in a CMOS silicon integrated circuit is ongoing. Although the FinFET device has a structure with a three-dimensional shape, it is difficult to overcome the limits of a two-dimensional device arrangement, and it is difficult to expect a process of stacking wafers to have a cost-reduction effect. If transistors are three-dimensionally stacked, the degree of integration thereof may continue to be improved, but it is difficult to apply this process to a CMOS silicon transistor because a thick wafer substrate (about 700 μm) is used as an element of the device construction.

Despite the low electrical mobility compared to existing CMOS silicon-based transistors, a thin-film transistor is receiving attention due to the promise of mass production at low cost, scalability to sensors, mechanical flexibility of devices, and the like. The thin-film transistor may be easily subjected to three-dimensional stacking because it is composed of a thin film and the substrate merely functions as a physical support, compared to silicon-based transistors.

Studies on three-dimensional stacking of thin-film transistors have been carried out, but are problematic in that two transistors are merely vertically stacked and there is no likelihood of expansion into an integrated circuit.

CITATION LIST

Patent Literature

Korean Patent No. 10-1076767
Korean Patent No. 10-1623958

SUMMARY OF THE INVENTION

Accordingly, the present invention has been made keeping in mind the problems encountered in the related art, and the present invention is intended to provide a logic circuit using three-dimensionally stacked dual-gate thin-film transistors, which is configured such that dual-gate thin-film transistors are three-dimensionally stacked, whereby the advantages of the dual-gate structure and of thin-film transistors may be exhibited together and the degree of integration can be drastically increased.

Therefore, an aspect of the present invention provides a logic circuit using three-dimensionally stacked dual-gate thin-film transistors, comprising: a first dual-gate thin-film transistor on a substrate; a second dual-gate thin-film transistor on the first dual-gate thin-film transistor; and a third dual-gate thin-film transistor on the second dual-gate thin-film transistor, wherein the first dual-gate thin-film transistor, the second dual-gate thin-film transistor and the third dual-gate thin-film transistor are electrically connected to each other.

In the logic circuit using three-dimensionally stacked dual-gate thin-film transistors according to an embodiment of the present invention, the first dual-gate thin-film transistor comprises a first bottom-gate electrode, a first dielectric layer on the first bottom-gate electrode, a first source electrode and a first drain electrode on the first dielectric layer, a first semiconductor channel layer between the first source electrode and the first drain electrode, a second dielectric layer on the first source electrode, the first drain electrode and the first semiconductor channel layer, and a first top-gate electrode on the second dielectric layer; the second dual-gate thin-film transistor comprises a second bottom-gate electrode, a third dielectric layer on the second bottom-gate electrode, a second source electrode and a second drain electrode on the third dielectric layer, a second semiconductor channel layer between the second source electrode and the second drain electrode, a fourth dielectric layer on the second source electrode, the second drain electrode and the second semiconductor channel layer, and a second top-gate electrode on the fourth dielectric layer; the third dual-gate thin-film transistor comprises a third bottom-gate electrode, a fifth dielectric layer on the third bottom-gate electrode, a third source electrode and a third drain electrode on the fifth dielectric layer, a third semiconductor channel layer between the third source electrode and the third drain electrode, a sixth dielectric layer on the third source electrode, the third drain electrode and the third semiconductor channel layer, and a third top-gate electrode on the sixth dielectric layer; the first top-gate electrode and the second bottom-gate electrode are the same electrode, and share the same space as each other; and the second top-gate electrode and the third bottom-gate electrode are the same electrode, and share the same space as each other.

Also, the first bottom-gate electrode may be electrically connected to the first top-gate electrode or the second bottom-gate electrode, the first source electrode may be electrically connected to the third source electrode, the second drain electrode may be electrically connected to the third drain electrode, and the second top-gate electrode or the third bottom-gate electrode may be electrically connected to the third top-gate electrode.

Also, the electrical connection may be realized through a conductive via hole.

In the logic circuit using three-dimensionally stacked dual-gate thin-film transistors according to an embodiment of the present invention, the second bottom-gate electrode and the second top-gate electrode of the second dual-gate thin-film transistor may be independently controlled.

Also, the first dual-gate thin-film transistor may be an N-type transistor, the second dual-gate thin-film transistor may be a P-type transistor, and the third dual-gate thin-film transistor may be an N-type transistor.

As such, the logic circuit may be a NAND gate.

Also, input 1 of the NAND gate may be applied to the second top-gate electrode and the third bottom-gate electrode, which share an electrode with each other, and input 2 thereof may be applied to the first top-gate electrode and the second bottom-gate electrode, which share an electrode with each other.

In the logic circuit using three-dimensionally stacked dual-gate thin-film transistors according to an embodiment of the present invention, the first dual-gate thin-film transistor may be a P-type transistor, the second dual-gate thin-film transistor may be an N-type transistor, and the third dual-gate thin-film transistor may be a P-type transistor.

As such, the logic circuit may be a NOR gate.

Also, input 1 of the NOR gate may be applied to the second top-gate electrode and the third bottom-gate electrode, which share an electrode with each other, and input 2 thereof may be applied to the first top-gate electrode and the second bottom-gate electrode, which share an electrode with each other.

Also, at least one selected from among the first, second and third bottom-gate electrodes, the first, second and third source electrodes, the first, second and third drain electrodes and the first, second and third top-gate electrodes may independently include at least one selected from among Au, Al, Ag, Be, Bi, Co, Cu, Cr, Hf, In, Mn, Mo, Mg, Ni, Nb, Pb, Pd, Pt, Rh, Re, Ru, Sb, Ta, Te, Ti, V, W, Zr, Zn, and PEDOT:PSS.

Also, the first semiconductor channel layer may include an n-type organic semiconductor material and/or inorganic semiconductor material, the second semiconductor channel layer may include a p-type organic semiconductor material and/or inorganic semiconductor material, and the third semiconductor channel layer may include an n-type organic semiconductor material and/or inorganic semiconductor material.

Also, the first semiconductor channel layer may include a p-type organic semiconductor material and/or inorganic semiconductor material, the second semiconductor channel layer may include an n-type organic semiconductor material and/or inorganic semiconductor material, and the third semiconductor channel layer may include a p-type organic semiconductor material and/or inorganic semiconductor material.

The n-type organic semiconductor may be at least one selected from among N2200 (poly{[N,N'-bis(2-octyldodecyl)-naphthalene-1,4,5,8-bis(dicarboximide)-2,6-diyl]-alt-5, 5'-(2,2'-bithiophene)}), anthracene, tetracene, hexacene, quinoline, naphthyridine, quinazoline, anthradithiophene, fullerene, perylenedicarboximide, naphthalene diimide, oligo-thiophene, 6,13-bis(triisopropylsilylethynyl)pentacene, 5,11-bis(triethylsilylethynyl)anthradithiophene, 2,8-difluoro-5,11-bis(triethylsilylethynyl)anthradithiophene, PCBM, Cu-phthalocyanine, and Zn-phthalocyanine, and the p-type organic semiconductor may be at least one selected from among diF-TES-ADT (2,8-difluoro-5,11-bis(triethylsilylethynyl)anthradithiophene), pentacene, poly(3-hexylthiophene), poly(3-pentylthiophene), poly(3-butylthiophene), poly(benzo[1,2-b:4,5-b']dithiophene), PBDT2FBT-2EHO (poly(4,8-bis(2-ethylhexyloxy)benzo[1,2-b:4,5-b']dithiophene-alt-4,7-bis(4-(2-ethylhexyl)-2-thienyl)-5,6-difluoro-2,1,3-benzothiadiazole), and PDPP3T (poly(diketopyrrolopyrrole-terthiophene)).

The p-type organic semiconductor is at least one selected from among diF-TES-ADT (2,8-difluoro-5,11-bis(triethylsilylethynyl)anthradithiophene), pentacene, poly(3-hexylthiophene), poly(3-pentylthiophene), poly(3-butylthiophene), poly(benzo[1,2-b:4,5-b']dithiophene), PBDT2FBT-2EHO (poly(4,8-bis(2-ethylhexyloxy)benzo[1,2-b:4,5-b']dithiophene-alt-4,7-bis(4-(2-ethylhexyl)-2-thienyl)-5,6-difluoro-2,1,3-benzothiadiazole), and PDPP3T (poly(diketopyrrolopyrrole-terthiophene)).

The n-type inorganic semiconductor may include at least one selected from among ZnO (zinc oxide), ZTO (zinc tin oxide), IZO (indium zinc oxide), IZTO (indium zinc tin oxide), and IGZO (indium gallium zinc oxide), and the p-type inorganic semiconductor may include at least one selected from among Ni oxide, Nb oxide, Cu oxide, α-doped Cu oxide (where α is boron, aluminum, gallium or indium), SrCu oxide, β-doped LaCu oxide (where β is sulfur or selenium) and PbS oxide.

At least one selected from among the first dielectric layer to the sixth dielectric layer may be independently at least one selected from among parylene, polydimethylsiloxane (PDMS), Cytop (CTL-809M, Asahi Glass), PMMA (poly (methyl methacrylate)), PVP (poly(vinylpyrrolidone)), PI (polyimide), and aluminum oxide ($Al_2O_3$).

In the logic circuit using three-dimensionally stacked dual-gate thin-film transistors according to an embodiment of the present invention, the first, second and third dual-gate thin-film transistors may be organic field-effect thin-film transistors.

Also, the first, second and third dual-gate thin-film transistors may have flexible properties.

In the logic circuit using three-dimensionally stacked dual-gate thin-film transistors according to an embodiment of the present invention, the substrate may include at least one selected from among a metal oxide, a semiconductor, glass, and a plastic.

Another aspect of the present invention provides a digital circuit, comprising the aforementioned logic circuit in a singular or plural number, the digital circuit being any one selected from the group consisting of NOT, AND, OR, NOR, XOR and NXOR.

According to the present invention, the logic circuit using three-dimensionally stacked dual-gate thin-film transistors is configured such that dual-gate thin-film transistors are three-dimensionally stacked, whereby the advantages of the dual-gate structure and of thin-film transistors can be exhibited together and the degree of integration can be drastically increased.

Also, a logic gate is made in the area of a single transistor, thereby remarkably simplifying wire and circuit designs.

BRIEF DESCRIPTION OF DRAWINGS

The exemplary embodiments of the present invention will be more clearly understood from the following detailed description taken in conjunction with the accompanying drawings, in which.

DESCRIPTION OF SPECIFIC EMBODIMENTS

Hereinafter, embodiments of the present invention are described in detail with reference to the appended drawings so as to be easily performed by a person having ordinary skill in the art, in which the drawings are not to be construed as limiting the technical idea of the present invention.

However, the following description does not limit the present invention to specific embodiments, and moreover, descriptions of known techniques, even if they are pertinent to the present invention, are considered unnecessary and may be omitted insofar as they would make the characteristics of the invention unclear.

The terms herein are used to explain specific embodiments and are not intended to limit the present invention. Unless otherwise stated, the singular expression includes a plural expression. In this application, the terms "include" or "have" are used to designate the presence of features, numbers, steps, operations, elements, parts, or combinations thereof described in the specification, and should be understood as not excluding the presence or additional possibility of one or more different features, numbers, steps, operations, elements, parts, or combinations thereof.

As used herein, the terms "first", "second", etc. may be used to describe various elements, but these elements are not to be limited by these terms. These terms are only used to distinguish one element from another. For example, a first element may be termed a second element, and, similarly, a second element may be termed a first element, without departing from the scope of the present invention.

Further, it will be understood that when an element is referred to as being "formed" or "stacked" "on" another element, it can be formed or stacked so as to be directly attached to all surfaces or one surface of the other element, or intervening elements may be present therebetween.

Figure 1A:
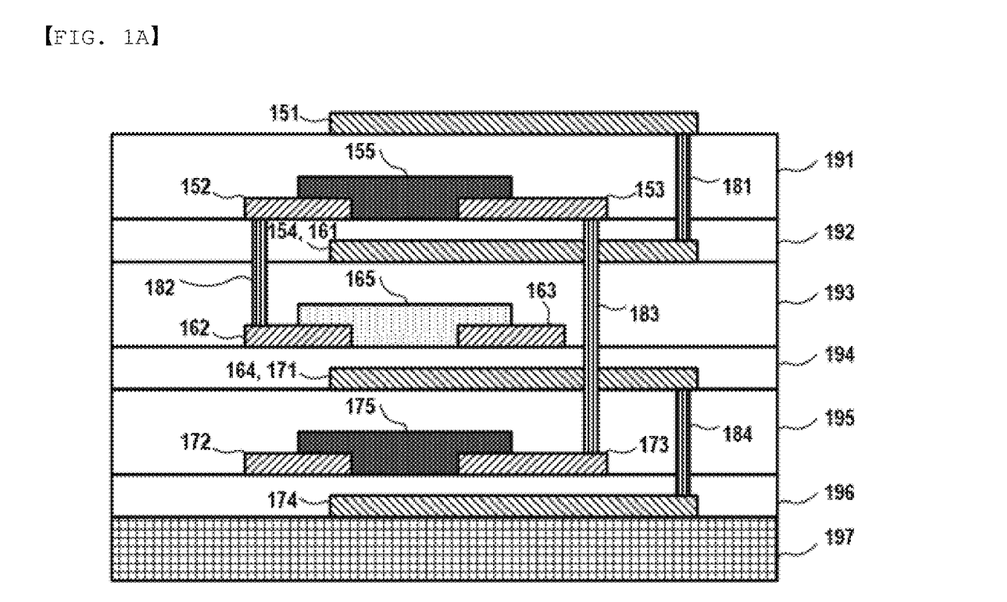
FIG. 1A is a cross-sectional view showing a logic circuit using three-dimensionally stacked dual-gate thin-film transistors according to an embodiment of the present invention.
Figure 1B:
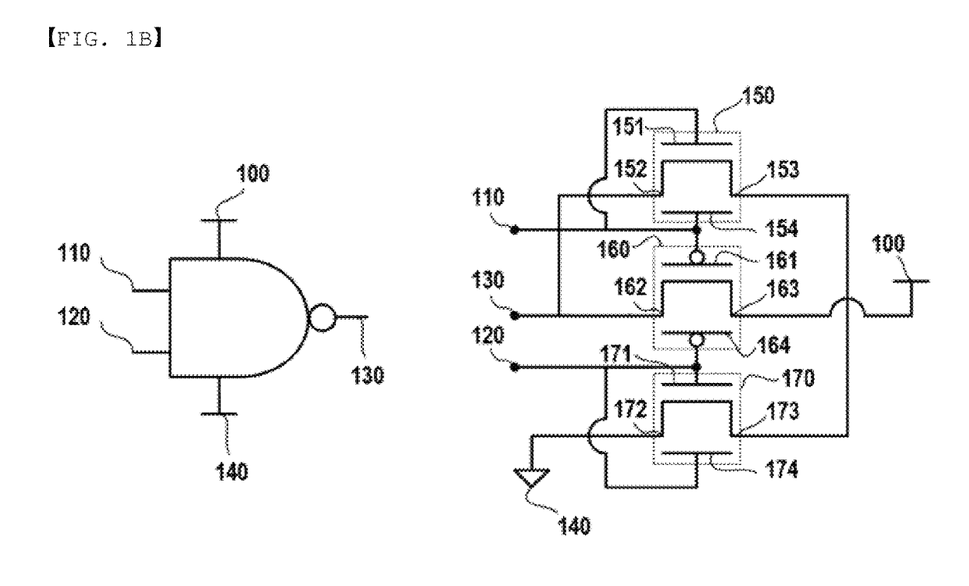
FIG. 1B shows the symbol (left) and the circuit diagram (right) of a NAND gate of the logic circuit of FIG. 1A.

FIG. 1A is a cross-sectional view showing the logic circuit using three-dimensionally stacked dual-gate thin-film transistors according to an embodiment of the present invention, and FIG. 1B shows a symbol and a circuit diagram of a NAND gate of the logic circuit of FIG. 1A.

Used in the present invention, a dual-gate transistor is described. Unlike a single-gate transistor which induces the formation of a channel in a single gate, the dual-gate transistor is configured such that gates are disposed at both sides of the channel between a source and a drain to thus induce the formation of a channel through field effects of both ends, thereby increasing current or charge mobility per unit area of the transistor and decreasing voltage and current so as to be equal to or less than the threshold, ultimately increasing the operational stability of the transistor. When compared with the single-gate transistor, the dual-gate transistor has high current per unit area, and thus the degree of integration of transistors in terms of current density is high. Furthermore, when a single dual-gate transistor, two different gates of which are independently controlled, is used as two single gates, which are connected in parallel, the degree of integration of transistors in terms of functionality may increase.

With reference to FIGS. 1A and 1B, the logic circuit using three-dimensionally stacked dual-gate thin-film transistors according to the present invention is configured to include a substrate 197 and three dual-gate thin-film transistors 150, 160, 170 sequentially layered on the substrate.

According to the present invention, the first dual-gate thin-film transistor 170 is disposed on the substrate 197, the second dual-gate thin-film transistor 160 is disposed on the first dual-gate thin-film transistor 170, and the third dual-gate thin-film transistor 150 is disposed on the second dual-gate thin-film transistor 160.

The first dual-gate thin-film transistor 170, the second dual-gate thin-film transistor 160 and the third dual-gate thin-film transistor 150 are electrically connected to each other.

In the logic circuit using three-dimensionally stacked dual-gate thin-film transistors according to the present invention, the first dual-gate thin-film transistor 170 includes a first bottom-gate electrode 174 positioned on the substrate 197 and a first source electrode 173 and a first drain electrode 172 positioned on the first bottom-gate electrode 174. A first semiconductor channel layer 175 is provided between the first source electrode 173 and the first drain electrode 172. A first top-gate electrode 171 is provided on the first source electrode 173, the first drain electrode 172 and the first semiconductor channel layer 175.

The second dual-gate thin-film transistor 160 includes a second bottom-gate electrode 164, which is shared with the first top-gate electrode 171, and a second source electrode 163 and a second drain electrode 162 positioned on the second bottom-gate electrode 164. A second semiconductor channel layer 165 is provided between the second source electrode 163 and the second drain electrode 162. A second top-gate electrode 161 is provided on the second source electrode 163, the second drain electrode 162 and the second semiconductor channel layer 165.

The third dual-gate thin-film transistor 150 includes a third bottom-gate electrode 154, which is shared with the second top-gate electrode 161, and a third source electrode 153 and a third drain electrode 152 positioned on the third bottom-gate electrode 154. A third semiconductor channel layer 155 is provided between the third source electrode 153 and the third drain electrode 152. A third top-gate electrode 151 is provided on the third source electrode 153, the third drain electrode 152 and the third semiconductor channel layer 155.

In the logic circuit using three-dimensionally stacked dual-gate thin-film transistors according to the present invention, the first bottom-gate electrode 174 and the first top-gate electrode 171 (or the second bottom-gate electrode 164) are electrically connected to each other by means of a via 184. Also, the first source electrode 173 and the third source electrode 153 are electrically connected to each other by means of a via 183, and the second drain electrode 162 and the third drain electrode 152 are electrically connected to each other by means of a via 182.

According to the present invention, the electrical connection may be realized by means of conductive via holes formed using a laser.

In the logic circuit using three-dimensionally stacked dual-gate thin-film transistors according to an embodiment of the present invention, the first dual-gate thin-film transistor 170 is an N-type transistor, the second dual-gate thin-film transistor 160 is a P-type transistor, and the third dual-gate thin-film transistor 150 is an N-type transistor.

As described above, N/P/N-type transistors are sequentially stacked from the first layer to the third layer, and the logic circuit functions as a NAND gate.

According to the present invention, three dual-gate thin-film transistors are stacked to make a single universal logic gate, and, based thereon, a digital circuit is designed. Moreover, the stacked three dual-gate transistors 150, 160, 170 share gates (which are located between them), thereby reducing the number of gate electrodes that are to be connected.

The P-type transistor 160 that is located at the second layer is able to independently control both two gates 161, 164 and is thus used as two single-gate transistors which are connected in parallel. Thus, three transistors are stacked, but the effect of stacking substantially four transistors may be exhibited.

Here, input 1 110 of the NAND gate is applied to the second top-gate electrode 154 and the third bottom-gate electrode 161, which share an electrode with each other, and input 2 120 is applied to the first top-gate electrode 171 and the second bottom-gate electrode 164, which share an electrode with each other.

FIG. 1B shows the symbol and the circuit diagram of the NAND gate.

With reference to FIG. 1B, the operation of the NAND gate is described below. The logic value of output 130 becomes 0 only when voltage corresponding to the logic value 1 is applied to both of two inputs 110, 120 of the NAND gate, and the logic value of output 130 becomes 1 when either of the two inputs 110, 120 is 0.

According to the present invention, the first semiconductor channel layer 175 is composed of an n-type organic semiconductor material and/or inorganic semiconductor material. Also, the second semiconductor channel layer 165 is composed of a p-type organic semiconductor material and/or inorganic semiconductor material, and the third semiconductor channel layer is composed of an n-type organic semiconductor material and/or inorganic semiconductor material.

An example of the n-type organic semiconductor used in the present invention may include, but is not limited to, at least one selected from among N2200 (poly{[N,N'-bis(2-octyldodecyl)-naphthalene-1,4,5,8-bis(dicarboximide)-2,6-diyl]-alt-5,5'-(2,2'-bithiophene)}), anthracene, tetracene, hexacene, quinolone, naphthyridine, quinazoline, anthradithiophene, fullerene, perylenedicarboximide, naphthalene diimide, oligo-thiophene, 6,13-bis(triisopropylsilylethynyl) pentacene, 5,11-bis(triethylsilylethynyl)anthradithiophene, 2,8-difluoro-5,11-bis(triethylsilylethynyl)anthradithiophene, PCBM, Cu-phthalocyanine, and Zn-phthalocyanine.

An example of the p-type organic semiconductor used in the present invention may include, but is not limited to, at least one selected from among diF-TES-ADT (2,8-difluoro-5,11-bis(triethylsilylethynyl)anthradithiophene), pentacene, poly(3-hexylthiophene), poly(3-pentylthiophene), poly(3-butylthiophene), poly(benzo[1,2-b:4,5-b']dithiophene), PBDT2FBT-2EHO (poly(4,8-bis(2-ethylhexyloxy)benzo[1,2-b:4,5-b']dithiophene-alt-4,7-bis(4-(2-ethylhexyl)-2-thienyl)-5,6-difluoro-2,1,3-benzothiadiazole), and PDPP3T (poly(diketopyrrolopyrrole-terthiophene)).

An example of the n-type inorganic semiconductor used in the present invention may include, but is not limited to, at least one oxide selected from among ZnO (zinc oxide), ZTO (zinc tin oxide), IZO (indium zinc oxide), IZTO (indium zinc tin oxide), and IGZO (indium gallium zinc oxide).

Also, an example of the p-type inorganic semiconductor may include, but is not limited to, at least one selected from among Ni oxide, Nb oxide, Cu oxide, α-doped Cu oxide (where α is boron, aluminum, gallium or indium), SrCu oxide, β-doped LaCu oxide (where β is sulfur or selenium), and PbS oxide.

The semiconductor material may include carbon nanotubes, or a two-dimensional semiconductor material such as graphene, etc.

According to the present invention, a first dielectric layer 196 is disposed to cover the first bottom-gate electrode 174, and a second dielectric layer 195 is disposed to cover the first source electrode 173, the first drain electrode 172 and the first semiconductor channel layer 175. Also, a third dielectric layer 194 is disposed to cover the second bottom-gate electrode 164, 171, and a fourth dielectric layer 193 is disposed to cover the second source electrode 163, the second drain electrode 162 and the second semiconductor channel layer 165. Also, a fifth dielectric layer 192 is disposed to cover the third bottom-gate electrode 154, 161, and a sixth dielectric layer 191 is disposed to cover the third source electrode 153, the third drain electrode 152 and the third semiconductor channel layer 155.

The material used for the first dielectric layer to the sixth dielectric layer 196~191 may include, but is not limited to, at least one selected from among parylene, polydimethylsiloxane (PDMS), Cytop (CTL-809M, Asahi Glass), PMMA (poly(methyl methacrylate)), PVP (poly(vinylpyrrolidone)), PI (polyimide), and aluminum oxide ($Al_2O_3$).

In the logic circuit using three-dimensionally stacked dual-gate thin-film transistors according to an embodiment of the present invention, the first, second and third bottom-gate electrodes 174, 164, 154, the first, second and third source electrodes 173, 163, 153, the first, second and third drain electrodes 172, 162, 152 and the first, second and third top-gate electrodes 171, 161, 151 may be independently formed of at least one selected from among Au, Al, Ag, Be, Bi, Co, Cu, Cr, Hf, In, Mn, Mo, Mg, Ni, Nb, Pb, Pd, Pt, Rh, Re, Ru, Sb, Ta, Te, Ti, V, W, Zr, Zn, and PEDOT:PSS.

In the logic circuit using three-dimensionally stacked dual-gate thin-film transistors according to an embodiment of the present invention, the first, second and third dual-gate thin-film transistors 170, 160, 150 may be organic field-effect thin-film transistors.

Here, the first, second and third dual-gate thin-film transistors 170, 160, 150 may have flexible properties.

In the logic circuit using three-dimensionally stacked dual-gate thin-film transistors according to an embodiment of the present invention, the substrate 197 may include, but is not limited to, at least one selected from among a metal oxide, a semiconductor, glass, and a plastic.

Figure 2A:
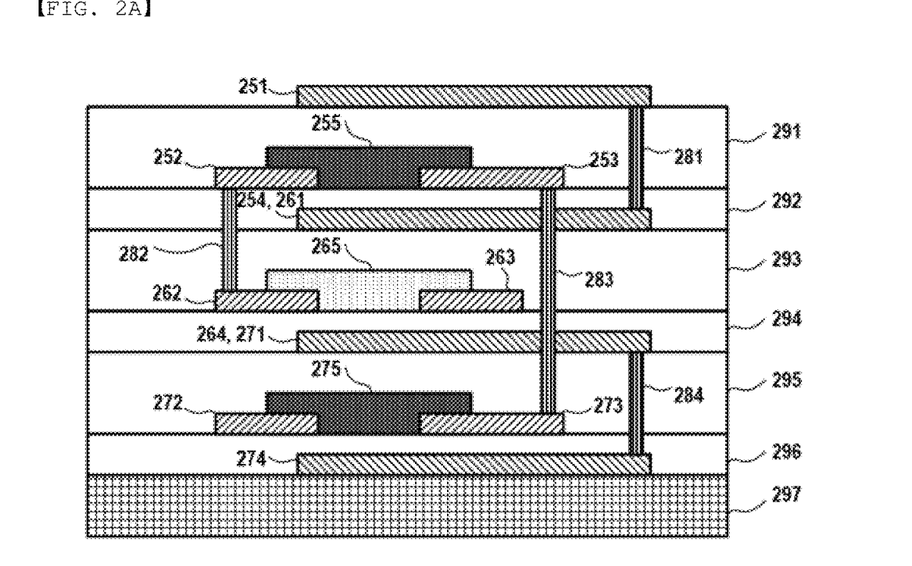
FIG. 2A is a cross-sectional view showing a logic circuit using three-dimensionally stacked dual-gate thin-film transistors according to another embodiment of the present invention.
Figure 2B:
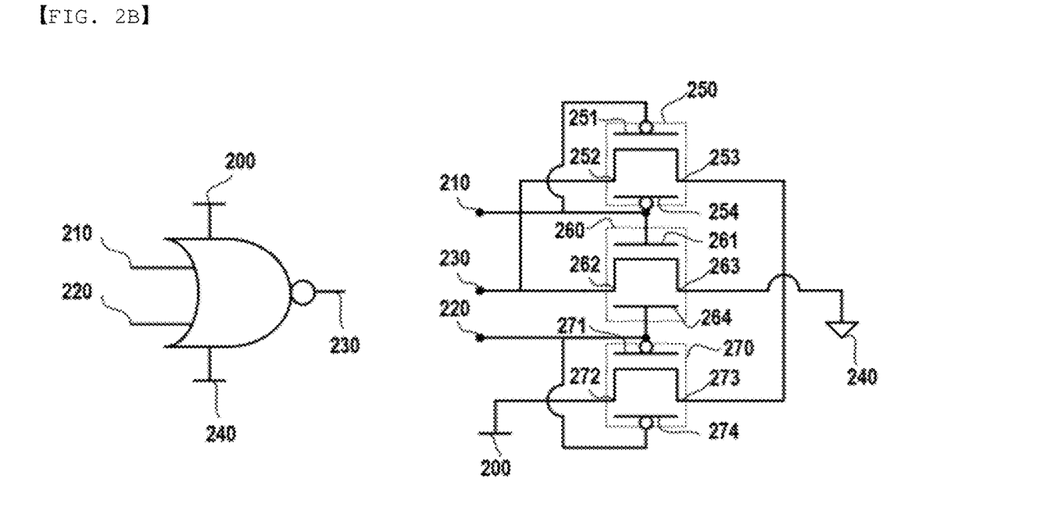
FIG. 2B shows the symbol (left) and the circuit diagram (right) of a NOR gate of the logic circuit of FIG. 2A.

FIG. 2A is a cross-sectional view showing a logic circuit using three-dimensionally stacked dual-gate thin-film transistors according to another embodiment of the present invention, and FIG. 2B shows the symbol and the circuit diagram of a NOR gate of the logic circuit of FIG. 2A.

In this embodiment, the physical constituents and stacking structure of the dual-gate thin-film transistors 270, 260, 250 remain the same as in the aforementioned embodiment, and a description thereof is omitted.

According to this embodiment, the first dual-gate thin-film transistor 270 is a P-type transistor, the second dual-gate thin-film transistor 260 is an N-type transistor, and the third dual-gate thin-film transistor 250 is a P-type transistor.

According to this embodiment, the logic circuit functions as a NOR gate.

FIG. 2B shows the symbol and the circuit diagram of the NOR gate.

With reference to FIG. 2B, the operation of the NOR gate is described below. The logic value of output 230 becomes 1 only when voltage corresponding to the logic value 0 is applied to both of two inputs 210, 220 of the NOR gate, and the logic value of output 230 becomes 0 when either of the two inputs 210, 220 is 1.

Figure 3:
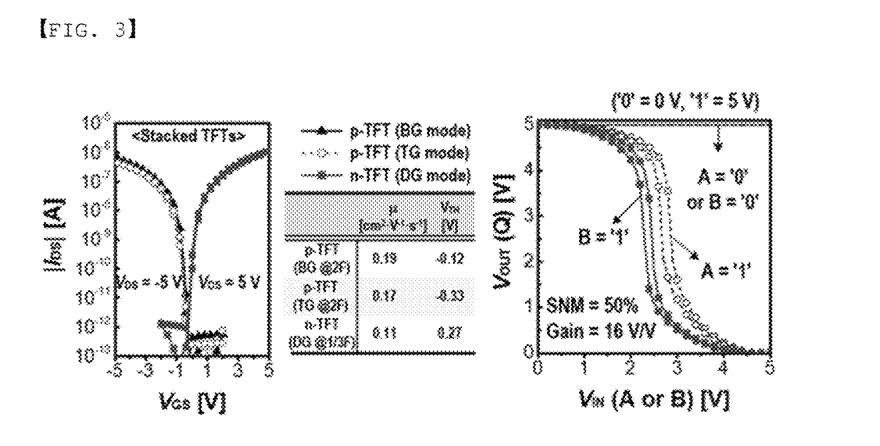
FIG. 3 is of graphs showing individual measurement transfer curves of three-dimensionally stacked N/P/N-type thin-film transistors according to the present invention and the results of measurement of DC properties of the NAND gate.

FIG. 3 is of graphs showing individual measurement transfer curves of three-dimensionally stacked N/P/N-type thin-film transistors according to the present invention and the results of measurement of DC properties of the NAND gate.

As shown in FIG. 3, the circuit using three-dimensionally stacked dual-gate thin-film transistors according to the present invention is capable of drastically reducing the circuit area through three-dimensional stacking, simplifying wire design, adjusting the electrical properties of each device through the thickness of the dielectric layer, and independently controlling two gates of the dual-gate transistor, thereby enabling effective logic circuit and analog designs.

Figure 4:
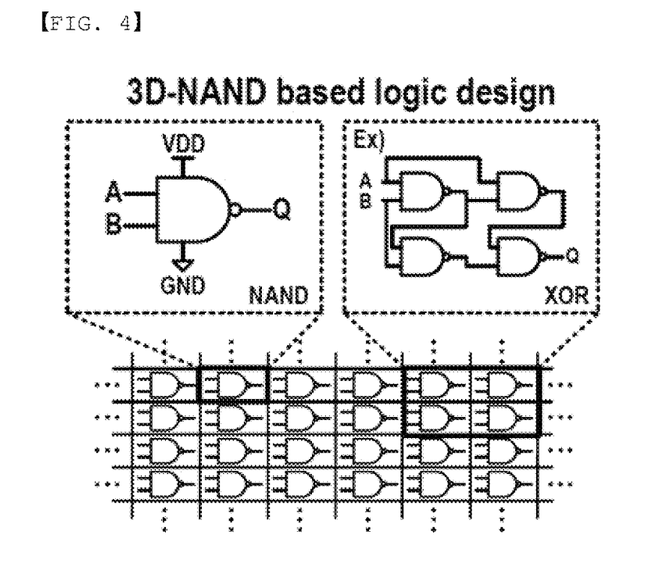
FIG. 4 shows an example of a three-dimensional NAND-based design.

FIG. 4 shows an example of the three-dimensional NAND-based circuit design according to the present invention. As shown in FIG. 4, the logic circuit according to the present invention may be effectively used for a flexible display.

EXAMPLE

Example 1

Figure 5:
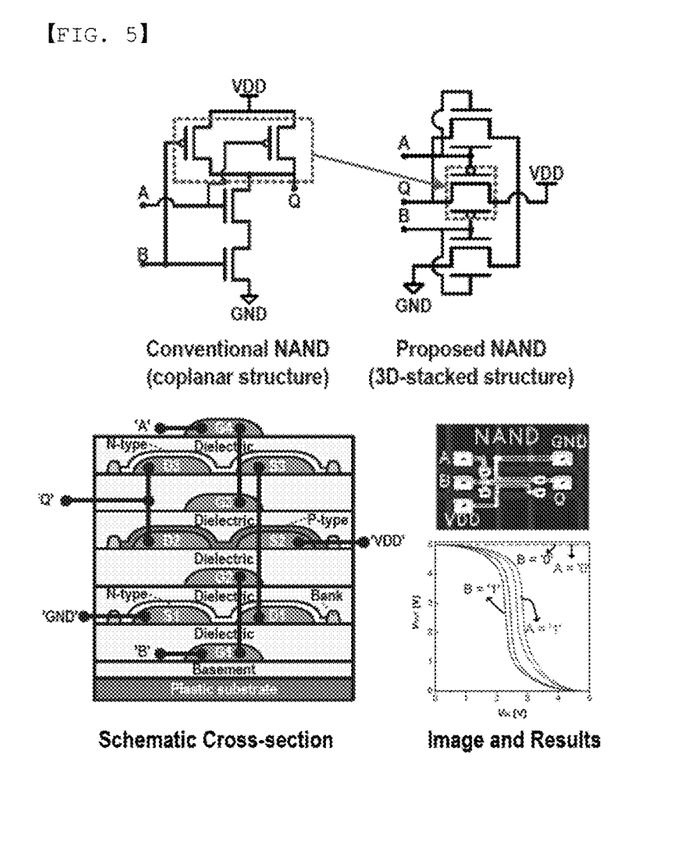
FIG. 5 shows the NAND gate in Example of the present invention.

With reference to FIG. 5, a NAND gate, which is the logic circuit using three-dimensionally stacked dual-gate thin-film transistors according to the present invention, was manufactured as follows. A plastic substrate was coated with Parylene using chemical vapor deposition. In order to form the first transistor layer, a gate electrode was printed, on which Parylene was then deposited as a dielectric layer by chemical vapor deposition. A source electrode and a drain electrode were printed on the Parylene layer, and an n-type organic semiconductor material was printed between the source electrode and the drain electrode.

Parylene was deposited thereon by chemical vapor deposition, thus completing the upper dielectric layer of the n-type transistor, on which a gate electrode was then printed, thereby completing a first-layer n-type dual-gate transistor. The upper gate electrode of the first-layer n-type dual-gate transistor was used as the lower gate electrode of a second-layer p-type dual-gate transistor. Parylene was then deposited by chemical vapor deposition thereon as the lower dielectric layer of the second-layer p-type dual-gate transistor. A source electrode and a drain electrode were printed thereon, after which a p-type organic semiconductor material was printed between the source electrode and the drain electrode.

Parylene was deposited thereon by chemical vapor deposition to thus complete the upper dielectric layer of the p-type transistor, and a gate electrode was printed thereon, thereby completing the second-layer p-type dual-gate transistor. The upper gate electrode of the second-layer p-type dual-gate transistor was used as the lower gate electrode of a third-layer n-type dual-gate transistor. Parylene was then deposited thereon by chemical vapor deposition as the lower dielectric layer of the third-layer n-type dual-gate transistor.

A source electrode and a drain electrode were printed thereon, after which an n-type organic semiconductor material was printed between the source electrode and the drain electrode. Parylene was then deposited thereon by chemical vapor deposition to thus complete the upper dielectric layer of the n-type transistor, and a gate electrode was printed thereon, thereby completing the third-layer n-type dual-gate transistor.

The upper and lower gate electrodes of the first-layer and third-layer n-type transistors were electrically connected to each other through vias. Thereby, the lower gate electrode of the second-layer p-type dual-gate transistor was electrically connected to the first-layer n-type gate electrode, and the upper gate electrode of the p-type dual-gate transistor was electrically connected to the third-layer n-type gate electrode.

The source electrode of the first-layer n-type transistor was electrically connected to the source electrode of the third-layer n-type transistor, and the drain electrode of the third-layer n-type transistor was electrically connected to the drain of the second-layer p-type transistor. The drain electrode of the first-layer n-type transistor was grounded, and a VDD power source was connected to the source electrode of the second-layer p-type transistor. Here, two gate electrodes, which are electrically connected, are two inputs of the NAND gate, and the drain electrodes of the second-layer and third-layer transistors, which are electrically connected, are output of the NAND gate.

Although preferred embodiments of the present invention have been disclosed for illustrative purposes, those skilled in the art will appreciate that diverse variations and modifications are possible through addition, alteration, deletion, etc. of elements, without departing from the spirit and scope of the invention. Thus, the above embodiments should be understood not to be limiting but to be illustrative. For example, respective elements described in an integrated form may be discretely used, and discrete elements may be used in a state of being combined. The scope of the present invention is defined by the claims, which will be described later, rather than by the above detailed description, and all variations or modifications deducible from the meanings, scope and equivalents of the claims are intended to be included in the scope of the present invention.

DESCRIPTION OF THE REFERENCE NUMERALS IN THE DRAWINGS

100: power source voltage (VDD)
110: NAND gate input 1
120: NAND gate input 2
130: NAND gate output
140: ground potential (GND)
150: third N-type transistor
151: third top-gate electrode
152: third drain electrode
153: third source electrode
154: third bottom-gate electrode (shared with 161)
155: third N-type semiconductor channel layer
160: second P-type transistor
161: second top-gate electrode (shared with 154)
162: second drain electrode
163: second source electrode
164: second bottom-gate electrode (shared with 171)
165: second N-type semiconductor channel layer
170: first N-type transistor
171: first top-gate electrode (shared 164)
172: first drain electrode
173: first source electrode
174: first bottom-gate electrode
175: first N-type semiconductor channel layer
181: via for connecting 151 and 154 (or 161)
182: via for connecting 152 and 162

183: via for connecting 153 and 173
184: via for connecting 164 (or 171) and 174
191, 192, 193, 194, 195, 196: sixth dielectric layer, fifth dielectric layer, fourth dielectric layer, third dielectric layer, second dielectric layer, first dielectric layer
197: substrate
200: power source voltage (VDD)
210: NOR gate input 1
220: NAND gate input 2
230: NOR gate output
240: ground potential (GND)
250: third P-type transistor
251: third top-gate electrode
252: third drain electrode
253: third source electrode
254: third bottom-gate electrode (shared with 261)
255: third N-type semiconductor channel layer
260: second N-type transistor
261: second top-gate electrode (shared with 254)
262: second drain electrode
263: second source electrode
264: second bottom-gate electrode (shared with 271)
265: second N-type semiconductor channel layer
270: first P-type transistor
271: first top-gate electrode (shared with 264)
272: first drain electrode
273: first source electrode
274: first bottom-gate electrode
275: first N-type semiconductor channel layer
281: via for connecting 251 and 254 (or 261)
282: via for connecting 252 and 262
283: via for connecting 253 and 273
284: via for connecting 264 (or 271) and 274
291, 292, 293, 294, 295, 296: sixth dielectric layer, fifth dielectric layer, fourth dielectric layer, third dielectric layer, second dielectric layer, first dielectric layer
297: substrate

What is claimed is:

1. A logic circuit using three-dimensionally stacked dual-gate thin-film transistors, comprising:
a first dual-gate thin-film transistor on a substrate;
a second dual-gate thin-film transistor on the first dual-gate thin-film transistor; and
a third dual-gate thin-film transistor on the second dual-gate thin-film transistor,
wherein the first dual-gate thin-film transistor, the second dual-gate thin-film transistor and the third dual-gate thin-film transistor are electrically connected to each other,
the first dual-gate thin-film transistor comprises a first bottom-gate electrode, a first dielectric layer on the first bottom-gate electrode, a first source electrode and a first drain electrode on the first dielectric layer, a first semiconductor channel layer between the first source electrode and the first drain electrode, a second dielectric layer on the first source electrode, the first drain electrode and the first semiconductor channel layer, and a first top-gate electrode on the second dielectric layer,
the second dual-gate thin-film transistor comprises a second bottom-gate electrode, a third dielectric layer on the second bottom-gate electrode, a second source electrode and a second drain electrode on the third dielectric layer, a second semiconductor channel layer between the second source electrode and the second drain electrode, a fourth dielectric layer on the second source electrode, the second drain electrode and the second semiconductor channel layer, and a second top-gate electrode on the fourth dielectric layer,
the third dual-gate thin-film transistor comprises a third bottom-gate electrode, a fifth dielectric layer on the third bottom-gate electrode, a third source electrode and a third drain electrode on the fifth dielectric layer, a third semiconductor channel layer between the third source electrode and the third drain electrode, a sixth dielectric layer on the third source electrode, the third drain electrode and the third semiconductor channel layer, and a third top-gate electrode on the sixth dielectric layer,
the first top-gate electrode and the second bottom-gate electrode are the same electrode, and share the same space as each other, and
the second top-gate electrode and the third bottom-gate electrode are the same electrode, and share the same space as each other.

2. The logic circuit of claim 1, wherein the first bottom-gate electrode, the second bottom-gate electrode, the third bottom-gate electrode, the first source electrode, the second source electrode, the third source electrode, the first drain electrode, the second drain electrode, the third drain electrode, the first top-gate electrode, the second top-gate electrode, and the third top-gate electrode independently include at least one selected from among Au, Al, Ag, Be, Bi, Co, Cu, Cr, Hf, In, Mn, Mo, Mg, Ni, Nb, Pb, Pd, Pt, Rh, Re, Ru, Sb, Ta, Te, Ti, V, W, Zr, Zn, and PEDOT:PSS.

3. The logic circuit of claim 1, wherein the first bottom-gate electrode is electrically connected to the first top-gate electrode or the second bottom-gate electrode,
the first source electrode is electrically connected to the third source electrode,
the second drain electrode is electrically connected to the third drain electrode, and
the second top-gate electrode or the third bottom-gate electrode is electrically connected to the third top-gate electrode.

4. The logic circuit of claim 3, wherein electrical connection is realized through a conductive via hole.

5. The logic circuit of claim 1, wherein the second bottom-gate electrode and the second top-gate electrode of the second dual-gate thin-film transistor are independently controlled.

6. The logic circuit of claim 1, wherein the first dual-gate thin-film transistor is an N-type transistor, the second dual-gate thin-film transistor is a P-type transistor, and the third dual-gate thin-film transistor is an N-type transistor.

7. The logic circuit of claim 6, wherein the logic circuit is a NAND gate.

8. The logic circuit of claim 7, wherein input 1 of the NAND gate is applied to the second top-gate electrode and the third bottom-gate electrode, which share an electrode with each other, and input 2 thereof is applied to the first top-gate electrode and the second bottom-gate electrode, which share an electrode with each other.

9. The logic circuit of claim 1, wherein the first dual-gate thin-film transistor is a P-type transistor, the second dual-gate thin-film transistor is an N-type transistor, and the third dual-gate thin-film transistor is a P-type transistor.

10. The logic circuit of claim 9, wherein the logic circuit is a NOR gate.

11. The logic circuit of claim 10, wherein input 1 of the NOR gate is applied to the second top-gate electrode and the third bottom-gate electrode, which share an electrode with each other, and input 2 thereof is applied to the first top-gate electrode and the second bottom-gate electrode, which share an electrode with each other.

12. The logic circuit of claim 1, wherein the first semiconductor channel layer includes an n-type organic semiconductor material and/or inorganic semiconductor material, the second semiconductor channel layer includes a p-type organic semiconductor material and/or inorganic semiconductor material, and the third semiconductor channel layer includes an n-type organic semiconductor material and/or inorganic semiconductor material.

13. The logic circuit of claim 12, wherein the n-type organic semiconductor is at least one selected from among N2200 (poly{[N,N'-bis(2-octyldodecyl)-naphthalene-1,4,5,8-bis(dicarboximide)-2,6-diyl]-alt-5,5'-(2,2'-bithiophene)}), anthracene, tetracene, hexacene, quinoline, naphthyridine, quinazoline, anthradithiophene, fullerene, perylenedicarboximide, naphthalene diimide, oligo-thiophene, 6,13-bis(triisopropylsilylethynyl)pentacene, 5,11-bis(triethylsilylethynyl)anthradithiophene, 2,8-difluoro-5,11-bis(triethylsilylethynyl)anthradithiophene, PCBM, Cu-phthalocyanine, and Zn-phthalocyanine, and the p-type organic semiconductor is at least one selected from among diF-TES-ADT (2,8-difluoro-5,11-bis(triethylsilylethynyl)anthradithiophene), pentacene, poly(3-hexylthiophene), poly(3-pentylthiophene), poly(3-butylthiophene), poly(benzo[1,2-b:4,5-b']dithiophene), PBDT2FBT-2EHO (poly(4,8-bis(2-ethylhexyloxy)benzo[1,2-b:4,5-b']dithiophene-alt-4,7-bis(4-(2-ethylhexyl)-2-thienyl)-5,6-difluoro-2,1,3-benzothiadiazole), and PDPP3T (poly(diketopyrrolopyrrole-terthiophene)).

14. The logic circuit of claim 12, wherein the n-type inorganic semiconductor includes at least one selected from among ZnO (zinc oxide), ZTO (zinc tin oxide), IZO (indium zinc oxide), IZTO (indium zinc tin oxide), and IGZO (indium gallium zinc oxide), and the p-type inorganic semiconductor includes at least one selected from among Ni oxide, Nb oxide, Cu oxide, α-doped Cu oxide (where α is boron, aluminum, gallium or indium), SrCu oxide, β-doped LaCu oxide (where β is sulfur or selenium), and PbS oxide.

15. The logic circuit of claim 1, wherein the first semiconductor channel layer includes a p-type organic semiconductor material and/or inorganic semiconductor material, the second semiconductor channel layer includes an n-type organic semiconductor material and/or inorganic semiconductor material, and the third semiconductor channel layer includes a p-type organic semiconductor material and/or inorganic semiconductor material.

16. The logic circuit of claim 15, wherein the n-type organic semiconductor is at least one selected from among N2200 (poly{[N,N'-bis(2-octyldodecyl)-naphthalene-1,4,5,8-bis(dicarboximide)-2,6-diyl]-alt-5,5'-(2,2'-bithiophene)}), anthracene, tetracene, hexacene, quinoline, naphthyridine, quinazoline, anthradithiophene, fullerene, perylenedicarboximide, naphthalene diimide, oligo-thiophene, 6,13-bis(triisopropylsilylethynyl)pentacene, 5,11-bis(triethylsilylethynyl)anthradithiophene, 2,8-difluoro-5,11-bis(triethylsilylethynyl)anthradithiophene, PCBM, Cu-phthalocyanine, and Zn-phthalocyanine, and the p-type organic semiconductor is at least one selected from among diF-TES-ADT (2,8-difluoro-5,11-bis(triethylsilylethynyl)anthradithiophene), pentacene, poly(3-hexylthiophene), poly(3-pentylthiophene), poly(3-butylthiophene), poly(benzo[1,2-b:4,5-b']dithiophene), PBDT2FBT-2EHO (poly(4,8-bis(2-ethylhexyloxy)benzo[1,2-b:4,5-b']dithiophene-alt-4,7-bis(4-(2-ethylhexyl)-2-thienyl)-5,6-difluoro-2,1,3-benzothiadiazole), and PDPP3T (poly(diketopyrrolopyrrole-terthiophene)).

17. The logic circuit of claim 15, wherein the n-type inorganic semiconductor includes at least one selected from among ZnO (zinc oxide), ZTO (zinc tin oxide), IZO (indium zinc oxide), IZTO (indium zinc tin oxide), and IGZO (indium gallium zinc oxide), and the p-type inorganic semiconductor includes at least one selected from among Ni oxide, Nb oxide, Cu oxide, α-doped Cu oxide (where α is boron, aluminum, gallium or indium), SrCu oxide, β-doped LaCu oxide (where β is sulfur or selenium), and PbS oxide.

18. The logic circuit of claim 1, wherein the first dielectric layer to the sixth dielectric layer independently include at least one selected from among parylene, polydimethylsiloxane (PDMS), Cytop (CTL-809M, Asahi Glass), PMMA (poly(methyl methacrylate)), PVP (poly(vinylpyrrolidone)), PI (polyimide), and aluminum oxide ($Al_2O_3$).

19. The logic circuit of claim 1, wherein the first dual-gate thin-film transistor, the second dual-gate thin-film transistor and the third dual-gate thin-film transistor are organic field-effect thin-film transistors.

20. The logic circuit of claim 1, wherein the first dual-gate thin-film transistor, the second dual-gate thin-film transistor and the third dual-gate thin-film transistor have flexible properties.

21. A digital circuit, comprising the logic circuit of claim 1 in a singular or plural number, the digital circuit being any one selected from the group consisting of NOT, AND, OR, NOR, XOR and NXOR.

* * * * *